United States Patent
Shu et al.

(10) Patent No.: US 9,229,329 B2
(45) Date of Patent: Jan. 5, 2016

(54) PEELING LIQUID FOR A RESIST

(71) Applicant: Boe Technology Group Co., Ltd., Beijing (CN)

(72) Inventors: Shi Shu, Beijing (CN); Lu Liu, Beijing (CN); Can Wang, Beijing (CN); Yonglian Qi, Beijing (CN); Guanbao Hui, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 119 days.

(21) Appl. No.: 14/093,737

(22) Filed: Dec. 2, 2013

(65) Prior Publication Data

US 2014/0179583 A1    Jun. 26, 2014

(30) Foreign Application Priority Data

Dec. 7, 2012  (CN) .......................... 2012 1 0523929

(51) Int. Cl.
  *G03F 7/42*   (2006.01)
  *C11D 11/00*  (2006.01)

(52) U.S. Cl.
  CPC ............ *G03F 7/425* (2013.01); *C11D 11/0047* (2013.01)

(58) Field of Classification Search
  CPC .................................................. C11D 11/0047
  See application file for complete search history.

(56) References Cited

U.S. PATENT DOCUMENTS 5,782,989 A  *  7/1998  Rueter ........................ 134/22.19
6,440,856 B1 *  8/2002  Bessho et al. ................. 438/691
2013/0273479 A9 * 10/2013 Quillen et al. ................ 430/329

FOREIGN PATENT DOCUMENTS

| CN | 101750914 A  | 6/2010 |
| CN | 102298277 A  | 12/2011 |
| EP |    773480 A1 | 5/1997 |
| WO | 2012047449 A3 | 9/2012 |

OTHER PUBLICATIONS

Text Portion of the Second Office Action for CN2012105239293, Jun. 27, 2014.
English translation of 3rd Office Action dated Dec. 2, 2014 received in corresponding Chinese Application No. 2012105239293.
English translation of fourth Office Action dated Apr. 23, 2015, received in corresponding Chinese Application No. 2012105239293.

* cited by examiner

*Primary Examiner* — Gregory Webb
(74) *Attorney, Agent, or Firm* — Kinney & Lange, P.A.

(57) ABSTRACT

The invention discloses a peeling liquid for a resist, which relates to an optical element and is used for removing the color resist and the protective layer on a color filter rapidly and efficiently. The peeling liquid for a color resist on a color filter comprises an alkali metal alkoxide with a mass percentage of 10-45%, an organic amine with a mass percentage of 10-30%, a surfactant with a mass percentage of 5-30%, a solvent with a mass percentage of 20-60%, and an alcohol with a mass percentage of 1-55% in terms of the peeling liquid for a resist with a mass percentage of 100%. The peeling liquid for a resist in invention is used for removing the color resist and the protective layer of the substandard product in a color filter.

5 Claims, No Drawings

PEELING LIQUID FOR A RESIST

FIELD OF THE INVENTION

The invention relates to an optical element, in particular, to a peeling liquid for a resist.

BACKGROUND OF THE INVENTION

A color filter comprises a black matrix layer on a glass substrate, color filtering layers (R, G, and B), etc. Here, in the procedure for producing the color filter, the process for forming each film layer is as follows.

Firstly, a layer of a photoresist corresponding to a film layer is coated on the glass substrate; then a pre-baking is performed; after the pre-baking, an exposing and a development is carried out; at the end a post-baking is conducted. Therefore, if substandard products are found during the procedure for producing the color filter, most of the founded substandard products have undergone the post-baking for at least once. Since the color resist after post-baking has been cross-linked and cured, it cannot be peeled from the substrate by a developing solution. Furthermore, a protective layer, which cannot be removed or peeled either, can form on the color resist layer.

Here, the black matrix material is generally a material comprising chrome or chromic oxide, or an organic material. The material of the color resist is generally a composition comprising an organic pigment, a photocurable component, a photo initiator, a base-soluble resin, a solvent and other additives. The material of the protective layer is generally a composition comprising a photocurable component, a photo initiator, a base-soluble resin, a solvent and other additives.

Disuse of glass substrate results in huge waste due to the high cost thereof, therefore it is possible to peel all of the film layers on the substrate of the substandard color filter and reuse it, in order to save cost. However, the purpose of cost saving cannot be achieved if the film layer is not peeled completely, or it takes too long time to peel it completely.

Accordingly, to provide a peeling liquid for a resist being able to remove the color resist and the protective layer rapidly and efficiently becomes a technical problem to be solved by those skilled in the art.

SUMMARY OF THE INVENTION

The object of the invention is to provide a peeling liquid for a resist for removing a color resist and a protective layer on a color filter rapidly and efficiently.

In order to achieve the above-mentioned object, the examples of the color peeling liquid for a resist on a color filter which is provided by the invention make use of the following technical solutions:

a peeling liquid for a resist, which comprising an alkali metal alkoxide with a mass percentage of 10-45%, an organic amine with a mass percentage of 10-30%, a surfactant with a mass percentage of 5-30%, a solvent with a mass percentage of 20-60%, and an alcohol with a mass percentage of 1-55% in terms of the peeling liquid for a resist with a mass percentage of 100%.

Furthermore, the peeling liquid for a resist comprises an alkali metal alkoxide with a mass percentage of 25-45%, an organic amine with a mass percentage of 10-20%, a surfactant with a mass percentage of 10-30%, a solvent with a mass percentage of 35-60%, and an alcohol with a mass percentage of 5-20% in terms of the peeling liquid for a resist with a mass percentage of 100%.

Preferably, the alkali metal alkoxide includes one or more of sodium alkoxide, lithium alkoxide, and potassium alkoxide.

Preferably, the alkali metal alkoxide includes one or more of sodium methoxide, sodium ethoxide, sodium n-propoxide, sodium iso-propoxide, sodium tert-butoxide, potassium methoxide, potassium ethoxide, potassium n-propoxide, potassium iso-propoxide, potassium tert-butoxide, lithium methoxide, lithium ethoxide, lithium n-propoxide, lithium iso-propoxide, and lithium tert-butoxide.

Preferably, the organic amine includes one or more of carbinolamine, ethanolamine, diethylamine, triethylamine, diethanolamine, triethanolamine, isopropanolamine, diisopropanolamine, and triisopropanolamine.

Preferably, the surfactant includes one or more of polyoxyethylene ether and polyoxypropylene ether.

Preferably, the solvent includes one or more of N-methylpyrrolidone, dipropylene glycol methyl ether, N,N-dimethylacetamide, and N,N-dimethylformamide.

Preferably, the alcohol includes one or more of methanol, ethanol, propanol, isopropanol, n-butanol, isobutanol, and tert-butanol.

The peeling liquid for a resist provided in the examples of the invention can remove the color resist and the protective layer on a color filter at a lower temperature and within a shorter period, without damaging the glass substrate. The glass substrate treated with the above-mentioned peeling liquid can be reused.

DETAILED DESCRIPTION OF THE INVENTION

The examples of the invention will be described in detail.

It should be understood, that the examples described herein are only a part of examples of the invention, but not all of them. Based on the examples herein, all other examples, which are obtained by those skilled in the art without inventive labour, belong to the protection scope of the invention.

In order to investigate such a more efficient peeling method for the color resist and the protective layer that the glass substrates of the color filter, which are essentially disused heretofore, can be recovered and used, the inventor carried out reiterative study. As the result, it is found that a rapid and efficient removal of the color resist and the protective layer can be achieved by using a peeling liquid composition having specific components. Thereby, the invention is accomplished.

The formulation of the peeling liquid for a resist provided by the invention comprises: an alkali metal alkoxide with a mass percentage of 10-45%, an organic amine with a mass percentage of 10-30%, a surfactant with a mass percentage of 5-30%, a solvent with a mass percentage of 20-60%, and an alcohol with a mass percentage of 1-55% in terms of the peeling liquid for a resist with a mass percentage of 100%. The peeling liquid for a resist can be used in the process for producing a color filter, for example, for removing the color resist and the protective layer rapidly and efficiently.

As a preferred example of the above-mentioned example, the peeling liquid for a resist comprises an alkali metal alkoxide with a mass percentage of 25-45%, an organic amine with a mass percentage of 10-20%, a surfactant with a mass percentage of 10-30%, a solvent with a mass percentage of 35-60%, and an alcohol with a mass percentage of 5-20% in terms of the peeling liquid for a resist with a mass percentage of 100%.

In the examples mentioned above, the alkali metal alkoxide is preferably one or more of sodium alkoxide, lithium alkoxide, and potassium alkoxide, which possesses a mass percentage of 10-45%, more specifically, of 10%, 25%, 30%, and 45%. The reason of that is when this mass percentage is lower than 10%, the peeling liquid cannot penetrate into the color resist and the protective layer, and thus cannot remove the color resist and the protective layer. When this mass percentage is higher than 45%, the swelling phenomenon will be enhanced so that the peeling liquid is delaminated, and it also possible to damage the optical properties of the glass substrate, which results in that the glass substrate becomes unreusable. Here, the alkali metal alkoxide can also be an alkali metal alkoxide comprising a C1-C4 alkyl group, more preferably, an alkali metal salt of lower alcohols comprising a C1-C4 alkyl group. For example, it can be one or more of sodium methoxide, sodium ethoxide, sodium n-propoxide, sodium iso-propoxide, sodium tert-butoxide, potassium methoxide, potassium ethoxide, potassium n-propoxide, potassium iso-propoxide, potassium tert-butoxide, lithium methoxide, lithium ethoxide, lithium n-propoxide, lithium iso-propoxide, and lithium tert-butoxide.

In the examples mentioned above, the organic amine can be an alkylamine or an alcoholamine comprising a C1-C6 alkyl group, specifically, one or more of carbinolamine, ethanolamine, diethylamine, triethylamine, diethanolamine, triethanolamine, isopropanolamine, diisopropanolamine, and triisopropanolamine. The mass percentage thereof is between 10-30%, more specifically, 10%, 20%, and 30%. The reason of that is when this mass percentage is lower than 10%, the peeling liquid cannot penetrate into the color resist and the protective layer, and thus cannot remove the color resist and the protective layer. When this mass percentage is higher than 30%, the swelling phenomenon will be enhanced so that the peeling liquid is delaminated.

In the examples mentioned above, the surfactant can be polyoxyethylenes and/or polyoxypropylenes, preferably, polyoxyethylene ethers, polyoxypropylene ethers, and more specifically, fatty acid-polyoxyethylene ethers, fatty alcohol-polyoxyethylene ethers, fatty acid-polyoxypropylene ethers or fatty alcohol-polyoxypropylene ethers. The mass percentage is between 5-30%, and more specifically, it can be 5%, 10%, 15%, and 30%. The reason of that is when this mass percentage is lower than 5%, the peeling liquid cannot penetrate into the color resist and the protective layer, and thus cannot remove the color resist and the protective layer. When this mass percentage is higher than 30%, the activity of the peeling liquid will be reduced and the color resist and the protective layer cannot be removed.

In the examples mentioned above, the solvent can be one or more of ketones, amines and ethers comprising a methyl group, and more specifically, can be one or more of N-methylpyrrolidone, dipropylene glycol methyl ether, N,N-dimethylacetamide, and N,N-dimethylformamide. The mass percentage is between 20-60%, more specifically, 20%, 29%, 35%, and 60%. When this mass percentage is lower than 20% or higher than 60%, the activity of the peeling liquid will be affected.

In the examples mentioned above, the alcohol can be a lower n-alcohol or iso-alcohol comprising a C1-C4 alkyl group, for example, one or more of methanol, ethanol, propanol, isopropanol, n-butanol, isobutanol, and tert-butanol. The mass percentage is between 1-55%, more specifically, 1%, 5%, 15%, 20%, and 55%. When this mass percentage is lower than 1% or higher than 55%, the activity of the peeling liquid will be affected.

The peeling liquid prepared as described above can remove the color resist and the protective layer on a color filter at a lower temperature and within a shorter period, without damaging the glass substrate. The glass substrate treated with the above-mentioned peeling liquid can be reused.

Preparation of Samples

Desired film layers were sequentially prepared from a black matrix and a color resist by a coating-exposing-developing process on a glass substrate. For example, the film layer of the black matrix has a thickness of 1.1 μm and the film layer of the color resist has a thickness of 1.9 μm. Each layer was subjected to a post-baking at 220° C. for 20 min. Furthermore, a protective layer having a film thickness of 2.0 μm was formed on the color resist layer. At the end, the color filter was cut into chip specimens to be used. The preparation of the samples can be set according to the requirement, wherein the thicknesses of the black matrix and the color resist, among others, also can be set according to the requirement, which are not limited herein.

Example 1

Preparation of a peeling liquid 1: Sodium n-propoxide with a mass percentage of 30%, diethanolamine with a mass percentage of 20%, polyoxyethylene ether with a mass percentage of 10%, N-methylpyrrolidone with a mass percentage of 35%, and ethanol with a mass percentage of 5% were mixed at room temperature (e.g. 23° C.) to form the peeling liquid 1. A chip specimen described above was immersed in the peeling liquid 1. The desquamation time of the film layer and the surface state after being washed with water were recorded.

Example 2

Preparation of a peeling liquid 2: Sodium ethoxide with a mass percentage of 25%, ethanolamine with a mass percentage of 20%, polyoxypropylene ether with a mass percentage of 15%, N-methylpyrrolidone with a mass percentage of 35% and isopropanol with a mass percentage of 5% were mixed at room temperature (e.g. 23° C.) to form the peeling liquid 2. A chip specimen described above was immersed in the peeling liquid 2. The desquamation time of the film layer and the surface state after being washed with water were recorded.

Example 3

Preparation of a peeling liquid 3: Potassium iso-propoxide with a mass percentage of 45%, diethanolamine with a mass percentage of 10%, polyoxypropylene ether with a mass percentage of 5%, dipropylene glycol methyl ether with a mass percentage of 20% and isopropanol with a mass percentage of 20% were mixed at room temperature (e.g. 23° C.) to form the peeling liquid 3. A chip specimen described above was immersed in the peeling liquid 3. The desquamation time of the film layer and the surface state after being washed with water were recorded.

Example 4

Preparation of a peeling liquid 4: Potassium ethoxide with a mass percentage of 10%, diethanolamine with a mass percentage of 30%, polyoxypropylene ether with a mass percentage of 30%, dipropylene glycol methyl ether with a mass percentage of 29% and isopropanol with a mass percentage of 1% were mixed at room temperature (e.g. 23° C.) to form the peeling liquid 4. A chip specimen described above was immersed in the peeling liquid 4. The desquamation time of the film layer and the surface state after being washed with water were recorded.

Example 5

Preparation of a peeling liquid 5: Potassium ethoxide with a mass percentage of 10%, diethanolamine with a mass percentage of 10%, polyoxypropylene ether with a mass percentage of 5%, dipropylene glycol methyl ether with a mass percentage of 60% and isopropanol with a mass percentage of 15% were mixed at room temperature (e.g. 23° C.) to form the peeling liquid 5. A chip specimen described above was immersed in the peeling liquid 5. The desquamation time of the film layer and the surface state after being washed with water were recorded.

Example 6

Preparation of a peeling liquid 6: Sodium iso-propoxide with a mass percentage of 10%, diisopropanolamine with a mass percentage of 10%, polyoxypropylene ether with a mass percentage of 5%, dipropylene glycol methyl ether with a mass percentage of 20% and tert-butanol with a mass percentage of 55% were mixed at room temperature (e.g. 23° C.) to form the peeling liquid 6. A chip specimen described above was immersed in the peeling liquid. The desquamation time of the film layer and the surface state after being washed with water were recorded.

The results of the experiments are shown in Table 1 below.

TABLE 1

|  | Desquamation Time | Residue After Being Washed With Water |
|---|---|---|
| Example 1 | 2 minutes and 30 seconds | none |
| Example 2 | 3 minutes and 15 seconds | none |
| Example 3 | 2 minutes and 20 seconds | none |
| Example 4 | 3 minutes and 19 seconds | none |
| Example 5 | 3 minutes and 22 seconds | none |
| Example 6 | 3 minutes and 20 seconds | none |

To sum above, the peeling liquid for a resist provided in the examples of the invention can remove the color resist and the protective layer on a color filter at a lower temperature (room temperature) and within a shorter period (within 5 min), without damaging the glass substrate. The glass substrate treated with the above-mentioned peeling liquid can be reused.

The peeling liquid for a resist provided in the invention can be used as the peeling liquid for the color resists used in a liquid crystal display of thin film transistor. In particular, it can be used as a peeling liquid for a color resist for removing the color resist or a coating film comprising a color resist (i.e. protective layer) on a substandard substrate during the production of the color filter so as to allow it becoming a black mask or substrate to be recovered and reused.

What described above are only the detailed embodiments of the invention. However, the protection scope of the invention is not limited thereto. Any modification or alternative, which can be easily envisaged by those skilled in the art according the technical extent disclosed in the invention, should be included in the protection scope of the invention. Therefore, the protection scope of the invention should be determined according to the protection scope of the claims.

What is claimed is:

1. A peeling liquid for a resist, characterized by comprising an alkali metal alkoxide with a mass percentage of 10-45%, an organic amine with a mass percentage of 10-30%, a surfactant with a mass percentage of 5-30%, a solvent with a mass percentage of 20-60%, and an alcohol with a mass percentage of 1-55% in terms of the peeling liquid for a resist with a mass percentage of 100%, wherein the solvent includes one or more of N-methylpyrrolidone, dipropylene glycol methyl ether, N,N-dimethylacetamide, and N, N-dimethylformamide, and wherein the alcohol includes one or more of methanol, ethanol, propanol, isopropanol, n-butanol, isobutanol, and tert-butanol.

2. The peeling liquid for a resist according to claim 1, characterized in that the alkali metal alkoxide includes one or more of sodium alkoxide, lithium alkoxide, and potassium alkoxide.

3. The peeling liquid for a resist according to claim 2, characterized in that the alkali metal alkoxide includes one or more of sodium methoxide, sodium ethoxide, sodium n-propoxide, sodium iso-propoxide, sodium tert-butoxide, potassium methoxide, potassium ethoxide, potassium n-propoxide, potassium iso-propoxide, potassium tert-butoxide, lithium methoxide, lithium ethoxide, lithium n-propoxide, lithium iso-propoxide, and lithium tert-butoxide.

4. The peeling liquid for a resist according to claim 1, characterized in that the organic amine includes one or more of carbinolamine, ethanolamine, diethylamine, triethylamine, diethanolamine, triethanolamine, isopropanolamine, diisopropanolamine, and triisopropanolamine.

5. The peeling liquid for a resist according to claim 1, characterized in that the surfactant includes one or more of polyoxyethylene ether and polyoxypropylene ether.

* * * * *